United States Patent
Lee et al.

(10) Patent No.: US 8,410,809 B2
(45) Date of Patent: Apr. 2, 2013

(54) UNDER-VOLTAGE AND OVER-VOLTAGE DETECTION CIRCUIT AND DRIVING METHOD THEREOF

(75) Inventors: Kyoungmin Lee, Seoul (KR); Duckki Kwon, Incheon (KR); Juho Kim, Seoul (KR); Eunchul Kang, Seoul (KR); Byongsung Lee, Gyeonggi-do (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 426 days.

(21) Appl. No.: 12/724,841

(22) Filed: Mar. 16, 2010

(65) Prior Publication Data

US 2010/0244885 A1  Sep. 30, 2010

(30) Foreign Application Priority Data

Mar. 24, 2009  (KR) .................. 10-2009-0025102

(51) Int. Cl.
*G01R 31/40* (2006.01)

(52) U.S. Cl. .................................. 324/764.01

(58) Field of Classification Search .............. None
See application file for complete search history.

(56) References Cited

U.S. PATENT DOCUMENTS

| | | | | |
|---|---|---|---|---|
| 4,525,637 A * | 6/1985 | Sano et al. | ...................... | 327/50 |
| 4,568,877 A * | 2/1986 | Tinsley | ...................... | 324/76.11 |
| 5,317,249 A * | 5/1994 | Ford | .............................. | 320/160 |
| 5,440,254 A | 8/1995 | Sundby | | |
| 5,705,913 A * | 1/1998 | Takeuchi et al. | .............. | 320/134 |
| 5,896,324 A | 4/1999 | Jang et al. | | |
| 6,492,849 B2 | 12/2002 | Ikoma et al. | | |
| 7,259,597 B2 | 8/2007 | Wu | | |
| 7,397,296 B1 * | 7/2008 | Kiani | ............................. | 327/333 |
| 7,733,155 B2 * | 6/2010 | Sukup et al. | .................. | 327/334 |
| 2005/0174125 A1 * | 8/2005 | Bhattacharya et al. | ....... | 324/522 |
| 2011/0248702 A1 * | 10/2011 | Kume | ........................... | 324/119 |

* cited by examiner

*Primary Examiner* — Jermele M Hollington
(74) *Attorney, Agent, or Firm* — Okamoto & Benedicto LLP

(57) ABSTRACT

A low-voltage and over-voltage detection circuit receives a power source voltage, generates a shift voltage by shifting the received voltage to a predetermined level, and fixes the shift voltage as a clamping voltage when the shift voltage is higher than a predetermined clamping voltage. The low-voltage and over-voltage detection circuit includes a first transistor and a second transistor. The first transistor generates a regulator voltage that varies according to the power source voltage and performs a switching operation according to the shift voltage and the regulator voltage, and the second transistor is connected in parallel with the first transistor and generates hysteresis. The low-voltage and over-voltage detection circuit determines whether the power source voltage is a low-voltage or an over-voltage by using a drain voltage generated according to currents flowing to the first and second transistors.

16 Claims, 4 Drawing Sheets

UNDER-VOLTAGE AND OVER-VOLTAGE DETECTION CIRCUIT AND DRIVING METHOD THEREOF

CROSS-REFERENCE TO RELATED APPLICATION

This application claims priority to and the benefit of Korean Patent Application No. 10-2009-0025102 filed in the Korean Intellectual Property Office on Mar. 24, 2009, the entire contents of which are incorporated herein by reference.

BACKGROUND OF THE INVENTION (a) Field of the Invention

The present invention relates to a low-voltage and over-voltage detection circuit and a driving method thereof.

(b) Description of the Related Art

In general, a device that determines a low-voltage or an overvoltage by detecting a voltage level includes a comparator. The comparator occupies a large area because it has a complicated configuration and requires many elements. In addition, a device for determining a low-voltage and a device for determining an over-voltage respectively include a comparator so that the number of elements required for the determination of the low-voltage and over-voltage is increased and the area for the devices also increases.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a low-voltage and over-voltage detection circuit having a simple configuration and occupying a small area, and a driving method thereof.

A low-voltage and over-voltage detection circuit according to an exemplary embodiment of the present invention includes: a level shifter receiving a power source voltage and shifting an input voltage to a predetermined level to generate a shift voltage; a voltage clamper maintaining the shift voltage at a clamping voltage when the shift voltage is higher than a predetermined clamping voltage; a voltage regulator generating a regulator voltage that varies according to the power source voltage; and a voltage detector receiving the shift voltage and the regulator voltage, including first and second transistors, and determining whether the power source voltage is a low-voltage or an over-voltage by using a drain voltage generated according to currents flowing to the first and second transistors, the first transistor performing a switching operation according to the two input voltages and the second transistor connected to the first transistor in parallel and generating hysteresis.

The voltage detector includes a driver receiving the drain voltage, determining the power source voltage to be included in a normal range when the drain voltage is close to the regulator voltage and generating a first-level detection signal, and determining the power source voltage as a low-voltage or an over-voltage when the drain voltage is close to the power source voltage and generating a second-level detection signal.

The first transistor has a gate electrode to which the shift voltage is input and a source electrode to which the regulator voltage is input, and the second transistor has a source electrode to which the regulator voltage is input and a gate electrode to which a reverse detection signal that is opposite to the detection signal is input.

The first and second transistors are n-channel type transistors. The level shifter includes a first current source having a first end to which the power source voltage is input, and generating a constant first current and a third transistor being diode-connected and flowing the constant current thereto.

The voltage damper includes a Zener diode row having a first end to which the shift voltage is applied and a second current source connected in parallel with the Zener diode row, and providing a path for the first current before the Zener diode row is turned on.

The voltage regulator includes: a first current source having a first end to which the power source voltage is applied, and generating a constant current; a first Zener diode having a cathode to which the power source voltage is input; a second current source connected to an anode of the first Zener diode; and a third transistor having a gate electrode connected to the anode of the first Zener diode and a source electrode to which the current of the first current source is supplied, and a voltage at the source electrode of the third transistor being equivalent to the regulator voltage.

The voltage detector includes a driver supplied with the power source voltage and the regulator voltage, receiving the drain voltage, determining the power source voltage to be included in a normal range when the drain voltage is close to the regulator voltage and generating a first-level detection signal, and determining the power source voltage to be a low-voltage or an over-voltage when the drain voltage is close to the power source voltage and generating a second-level detection signal.

The first transistor has a gate electrode to which the shift voltage is input and a source electrode connected to a source electrode of the third electrode, and the second transistor has a gate electrode to which a reverse detection signal that is opposite to the detection signal is input and a source electrode connected to the source electrode of the third transistor. When the power source voltage is increased, the regulator voltage sequentially includes: a first period during which the regulator voltage is linearly increased or decreased according to the power source voltage; a second period during which the regulator voltage is maintained at a constant level; and a third period during which the regulator voltage is linearly increased or decreased according to the power source voltage, and when the power source voltage is decreased, the regulator voltage sequentially includes the third period, the second period, and the first period. When the power source voltage is increased, the shift voltage sequentially includes: a first period during which the shift voltage is maintained at a ground voltage; a second period during which the shift voltage is linearly increased or decreased; and a third period during which the shift voltage is constantly maintained at the clamping voltage, and when the power source voltage is decreased, the shift voltage sequentially includes the third period, the second period, and the first period.

A driving method of a low-voltage and over-voltage detection circuit including a first transistor and a second transistor connected in parallel with the first transistor, includes: receiving a power source voltage and generating a shift voltage by shifting the power source voltage to a predetermined level; when the shift voltage is higher than a predetermined clamping voltage, fixing the shift voltage as a clamping voltage; generating a regulator voltage that varies according to the power source voltage; switching the first transistor according to the shift voltage and the regulator voltage; determining the power source voltage to be included in a normal range when drain voltages of the first and second transistors are close to the regulator voltage and generating a first-level detection signal, and determining the power source voltage to be a low-voltage or an over-voltage when the drain voltages are close to the power source voltage and generating a second-level detection signal; and switching the second transistor according to a reverse detection signal that is opposite to the detection signal.

The switching the first transistor includes inputting the shift voltage to a gate electrode of the first transistor and inputting the regulator voltage to a source electrode of the first transistor.

The switching the second transistor includes inputting the reverse detection signal to a gate electrode of the second transistor and inputting the regulator voltage to a source electrode of the second transistor.

When the power source voltage is increased, the regulator voltage sequentially includes: a first period during which the regulator voltage is linearly increased or decreased according to the power source voltage; a second period during which the regulator voltage is maintained at a constant level; and a third period during which the regulator voltage is linearly increased or decreased according to the power source voltage, and when the power source voltage is decreased, the regulator voltage sequentially includes the third period, the second period, and the first period.

When the power source voltage is increased, the shift voltage sequentially includes: a first period during which the shift voltage is maintained at a ground voltage; a second period during which the shift voltage is linearly increased or decreased; and a third period during which the shift voltage is constantly maintained at the clamping voltage, and when the power source voltage is decreased, the shift voltage sequentially comprises the third period, the second period, and the first period.

According to the present invention, a low-voltage and over-voltage detection circuit that can detect a low-voltage or an over-voltage with simple configuration and structure and is smaller than a conventional detection circuit in area, and a driving method thereof are provided.

DETAILED DESCRIPTION OF THE EMBODIMENTS

Figure 1:
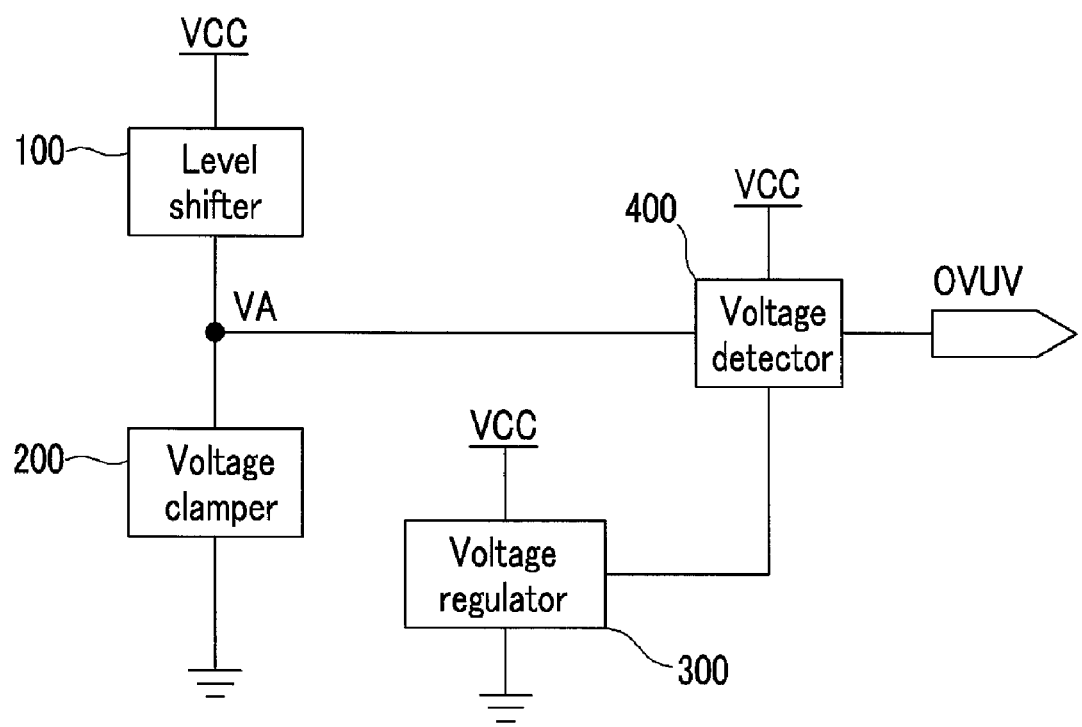
FIG. 1 shows a low-voltage and over-voltage detection circuit according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereinafter, a low-voltage and over-voltage detection circuit according to an exemplary embodiment of the present invention will be described.

FIG. 1 shows a detection circuit according to the exemplary embodiment of the present invention.

As shown in FIG. 1, a low-voltage and over-voltage detection circuit includes a level shifter 100, a voltage clamper 200, a voltage regulator 300, and a voltage detector 400.

The level shifter 100 receives a power source voltage VCC, and shifts the received voltage to a predetermined level to generate a shift voltage VA.

The voltage clamper 200 fixes the shift voltage VA as a clamping voltage Vclamp when the shift voltage VA is greater than a predetermined clamping voltage Vclamp.

The voltage regulator 300 supplies a regulator voltage Vreg that varies according to the power source voltage VCC to the voltage detector 400.

The voltage detector 400 receives the shift voltage VA and the regulator voltage Vreg, generates hysteresis with a reverse detection signal OVUV_R fed back from the voltage detector 400, and generates a detection signal OVUV when the shift voltage VA is lower than the regulator voltage Vreg.

Figure 2:
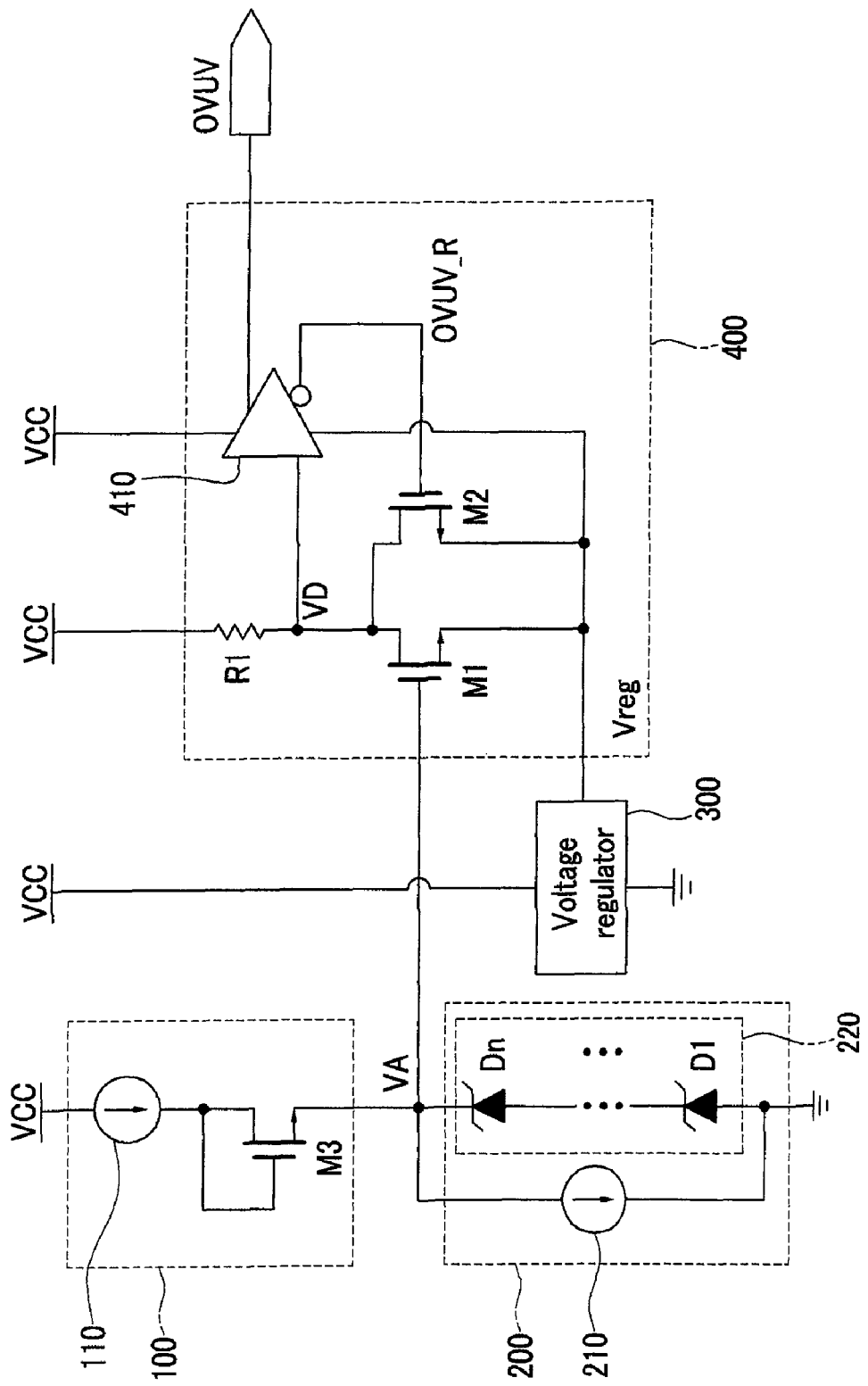
FIG. 2 is a detailed view of the low-voltage and over-voltage detection circuit according to the exemplary embodiment of the present invention.

FIG. 2 is a detailed view of the low-voltage and over-voltage detection circuit according to the exemplary embodiment of the present invention. The detection circuit will be described in further detail with reference to FIG. 2.

The level shifter 100 includes a constant current source 110 and a transistor M3. The constant current source 110 generates a constant current, and the transistor M3 is diode-connected. The current source 110 is connected in series to the diode-connected transistor M3. A voltage obtained by subtracting a threshold voltage of the transistor M3 from the power source voltage VCC becomes the shift voltage VA. When the power source voltage VCC is lower than the threshold voltage of the transistor M3, the diode-connected transistor M3 is blocked so that a ground voltage becomes the shift voltage VA. When the power source voltage VCC is higher than the threshold voltage of the transistor M3, the transistor M3 is turned on and the shift voltage VA starts to increase along the power source voltage VCC. When the shift voltage is increased to the clamping voltage Vclamp, all Zener diodes are turned on so that the shift voltage VA is maintained at the clamping voltage Vclamp.

The voltage clamper 200 includes a constant current source 210 and a row of Zener diodes 220 formed of a plurality of Zener diodes D1 to Dn that are connected in series. The number of Zener diodes connected in series determines the clamping voltage Vclamp. The sum of breakdown voltages of the plurality of Zener diodes becomes the clamping voltage Vclamp. The constant current source 210 is connected in parallel with the row of Zener diodes 220, and interacts with the constant current source 110 of the level shifter 100 so supply a constant voltage to lateral ends of the transistor M3. That is, a path for a constant current of the constant current source 110 is provided before the Zener diode row formed of the plurality of Zener diodes D1 to DN is turned on.

The voltage detector 400 includes a transistor M1, a transistor M2, a resistor R1, and a driver 410.

The driver 410 generates a detection signal OVUV and a reverse detection signal OVUV_R according to a drain voltage VD. The driver 410 is supplied with the power source voltage VCC and the regulator voltage Vreg, and the drain voltage VD is input thereto. According to a current flowing to the transistors M1 and M2, a voltage drop is generated at lateral sides of the resistor R1. The drain voltage VD is a voltage obtained by subtracting a voltage at lateral ends of the resistor R1 from the power source voltage VCC. The driver 410 generates a high-level detection signal OVUV and a low-level reverse detection signal OVUV_R when the drain voltage VD is close to the power source voltage VCC and outputs the generated signals, and generates a low-level detection signal OVUV and a high-level reverse detection signal OVUV_R when the drain voltage VD is close to the regulator voltage Vreg and outputs the generated signals. The shift voltage VA and the regulator voltage Vreg are respectively input to a gate electrode and a source electrode of the transistor M1. The reverse detection signal OVUV_R signal and the regulator voltage Vreg are respectively input to a gate electrode and a source electrode of the transistor M2. Drain electrodes of the transistors M1 and M2 are connected to a first end of the resistor R1 and an input terminal of the driver 410, and the power source voltage VCC is input to a second end of the resistor R. Since a voltage at the resistor R1 is changed according to turn-on/off of the transistor M2, hysteresis is generated in the voltage detector 400.

Hereinafter, operation of the low-voltage and over-voltage detection circuit and the hysteresis generated in the voltage detector 400 according to the exemplary embodiment of the present invention will be described in further detail.

Figure 3:
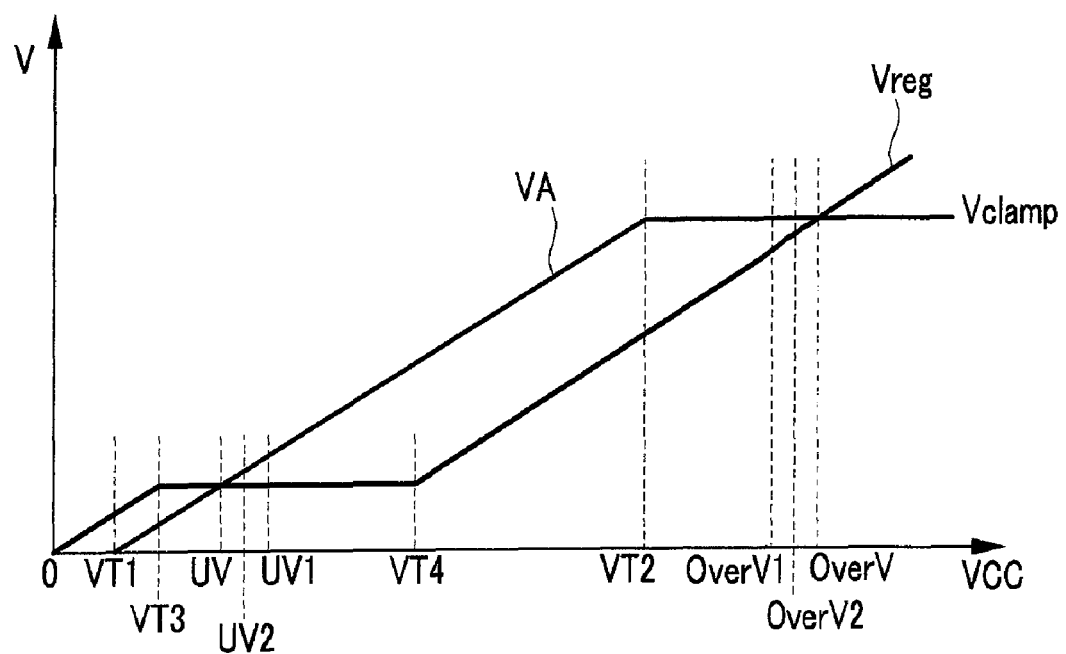
FIG. 3 shows a shift voltage and a regulation voltage according to the exemplary embodiment of the present invention.

FIG. 3 shows the shift voltage VA and the regulator voltage Vreg according to the exemplary embodiment of the present invention.

In FIG. 3, the horizontal axis indicates the power source voltage VCC and the vertical axis indicates a voltage level. A range in which the power source voltage VCC is between a threshold low voltage UV to an over-voltage OverV is referred to as a normal range, a range in which the power source voltage VCC is lower than the threshold low voltage UV is referred to as a low-voltage range, and a range in which the power source voltage VCC is higher than the threshold high voltage OverV is referred to as an over-voltage range.

When the power source voltage VCC is lower than a first voltage VT1, the shift voltage VA is the ground voltage. When the power source voltage VCC is between the first voltage VT1 and a second voltage VT2, the shift voltage VA is linearly increased or decreased according to the power source voltage VCC. When the power source voltage VCC is higher than the second voltage VT2, the shift voltage VA is constantly maintained at the clamping voltage Vclamp. When the power source voltage VCC is lower than a third voltage VT3, the regulator voltage Vreg is linearly increased or decreased according to the power source voltage VCC. When the power source voltage VCC is between the third voltage VT3 and a fourth voltage VT4, the regulator voltage Vreg is constantly maintained. When the power source voltage VCC is higher than the fourth voltage VT4, the regulator voltage Vreg is linearly increased or decreased according to the power source voltage VCC.

A case in which the power source voltage VCC is increased from the low voltage range to the normal range and a case in which the power source voltage VCC is decreased from the normal range to the low voltage range will now be described.

In the low voltage range, gate voltages (i.e., shift voltages VA) of the transistors M1 and M2 are lower than a source voltage (i.e., regulator voltage Vreg) so that the transistors M1 and M2 are in the turn-off state. In this case, since no current flows in the resistor R1, the drain voltage VD is equal to the power source voltage VCC. Therefore, the driver 410 generates a high-level detection signal OVUV and a low-level reverse detection signal OVUV_R. When the power source voltage VCC is higher than the threshold low voltage, the gate voltage of the transistor M1 is greater than the source voltage, and when the power source voltage VCC becomes a voltage UV1, a gate-source voltage of the transistor M1 reaches the threshold voltage so that a current starts to flow. Then, the drain voltage VD becomes lower than the power source voltage VCC due to a voltage drop occurred by the current flowing into the resistor R1. As the power source voltage VCC is increased, the shift voltage VA applied to the transistor M1 is increased so that the gate-source voltage of the transistor M1 is increased. Then, the current flowing in the resistor R1 is increased so that the drain voltage VD is withdrawn from the power source voltage VCC and becomes closer to the regular voltage Vreg. When the drain voltage VD is closer to the regulator voltage Vref than to the power source voltage VCC, the driver 410 changes the detection signal OVUV to low level from high level and changes the reverse detection signal OVUV_R from low level to high level. The transistor M2 is turned on by the high-level reverse detection signal OVUV_R. When the power source voltage VCC is in the normal range, the transistor M1 and the transistor M2 are turned on. A current flows to the two transistors so that the current flowing in the resistor R1 is increased.

On the contrary, when the power source voltage VCC is changed to the low-voltage range from the normal range, the two transistors M1 and M2 are turned off from the turn-on state. The current flowing in the resistor
R1 when the transistors M1 and M2 are in the turn-off state is greater than the current flowing in the resistor R1 when the transistor M1 is turned on. Although the power source voltage VCC is decreased to the voltage UV1 and thus the transistor M1 is turned off, the transistor M2 is still in the turn-on state and therefore the drain voltage VD becomes closer to the regulator voltage Vreg than to the power source voltage VCC. When the regulator voltage Vreg is maintained at a constant level and the power source voltage VCC is decreased to the voltage UV2, the drain voltage VD becomes further closer to the power source voltage VCC so that the driver 410 changes the detection voltage OVUV to high level from low level.

As described, the voltage detector 400 according to the exemplary embodiment of the present invention determines the range (i.e., low-voltage range or normal range) of the power source voltage VCC according to an increase or decrease of the power source voltage VCC due to hysteresis.

A case in which the power source voltage VCC is increased from the normal range to the over-voltage range and a case in which the power source voltage VCC is decreased from the over-voltage range to the normal range will now be described.

Since a voltage difference between the regulator voltage Vreg and the shift voltage VA is continuously increased while the power source voltage VCC is increased to a fourth voltage VT4 from the normal range, the current flows to the transistor M1 so that the current flowing in the resistor R1 is increased. When the power source voltage VCC becomes higher than the fourth voltage VT4, the gate-source voltage of the transistor M1 is constant and the gate-source voltage of the transistor M2 is decreased so that the current flowing to the transistor M1 is maintained at a constant level and the current flowing to the transistor M2 is gradually decreased. Accordingly, the current flowing in to resistor R1 is decreased. However, although the current flowing in the resistor R1 is decreased, the drain voltage VD is closer to the regulator voltage Vreg than to the power source voltage VCC due to a voltage drop at the lateral ends of the resistor R1. When the power source voltage VCC is higher than the second voltage VT2, the shift voltage VA is maintained at the clamping voltage Vclamp, and therefore the currents flowing to the transistors M1 and M2 are decreased and the drain voltage VD is gradually increased to close to the power source voltage VCC.

When the power source voltage VCC is at a voltage OverV1 that is below the threshold overvoltage OverV, a voltage difference between the shift voltage VA and the regulator voltage Vreg is smaller than the threshold voltage of the transistor M1 so that the transistor M1 is turned off. Then, the current flows to the transistor M2 and the current flowing in the resistor R1 is decreased so that the drain voltage VD is further increased. When the power source voltage VCC reaches a voltage OverV2, the current flowing to the transistor M2 is further decreased so that the drain voltage VD becomes closer to the power source voltage VCC than to the regulator voltage Vreg. In this case, the driver 410 changes the detection signal OVUV from low level to high level, and changes the reverse detection signal OVUV_R from high level to low level. The transistor M2 is turned off by the reverse detection signal OVUV_R, and the drain voltage VD becomes equivalent to the power source voltage VCC.

On the contrary, a case in which the power source voltage VCC falls to the normal range from the over-voltage range will now be described. In the over-voltage range, the transistor M1 and the transistor M2 are in the turn-off state and the drain voltage VD is equivalent to the power source voltage VCC. When the power source voltage VCC is lower than the threshold over-voltage OverV, the gate voltage of the transistor M1 is higher than the source voltage, and when the power source voltage becomes the voltage OverV1, the gate-source voltage of the transistor M1 becomes the threshold voltage and the transistor M1 is turned on. Then, the drain voltage VD becomes lower than the power source voltage VCC due to a voltage drop generated by flow of the current of the transistor M1 to the resistor R1. As the power source voltage VCC is decreased, the regulator voltage Vreg applied to the source electrode of the transistor M1 is decreased so that the gate-source voltage of the transistor M1 is increased. Then, the current flowing in the resistor R1 is increased so that the drain voltage VD becomes further from the power source voltage VCC and becomes closer to the regulator voltage Vreg. When the drain voltage VD is closer to the regulator voltage Vreg than to the power source voltage VCC, the driver 410 changes the detection signal OVUV to high level from low level and changes the reverse detection signal OVUV_R from low level to high level. The transistor M2 is turned on by the high-level reverse detection signal OVUV_R.

The gate-source voltage of the transistor M1 should be high in order to make a current flowing in the resistor R1 when the power source voltage VCC is changed from the over-voltage range to the normal range equivalent to a current flowing in the resistor R1 when the power source voltage VCC is changed from the normal range to the over-voltage range. That is, a current difference between a current flowing in the resistor R1 when the transistor M1 is turned on and a current flowing in the resistor R1 when the transistors M1 and M2 are turned on causes generation of hysteresis in the voltage detector 400. As described, the voltage detector 400 according to the exemplary embodiment of the present invention determines a range to which the power source voltage VCC is included among the over-voltage range and the normal range according to the increase or decrease of the power source voltage VCC due to hysteresis.

Hereinafter, the voltage regulator 300 according to the exemplary embodiment of the present invention will be described in further detail with reference to FIG. 4.

Figure 4:
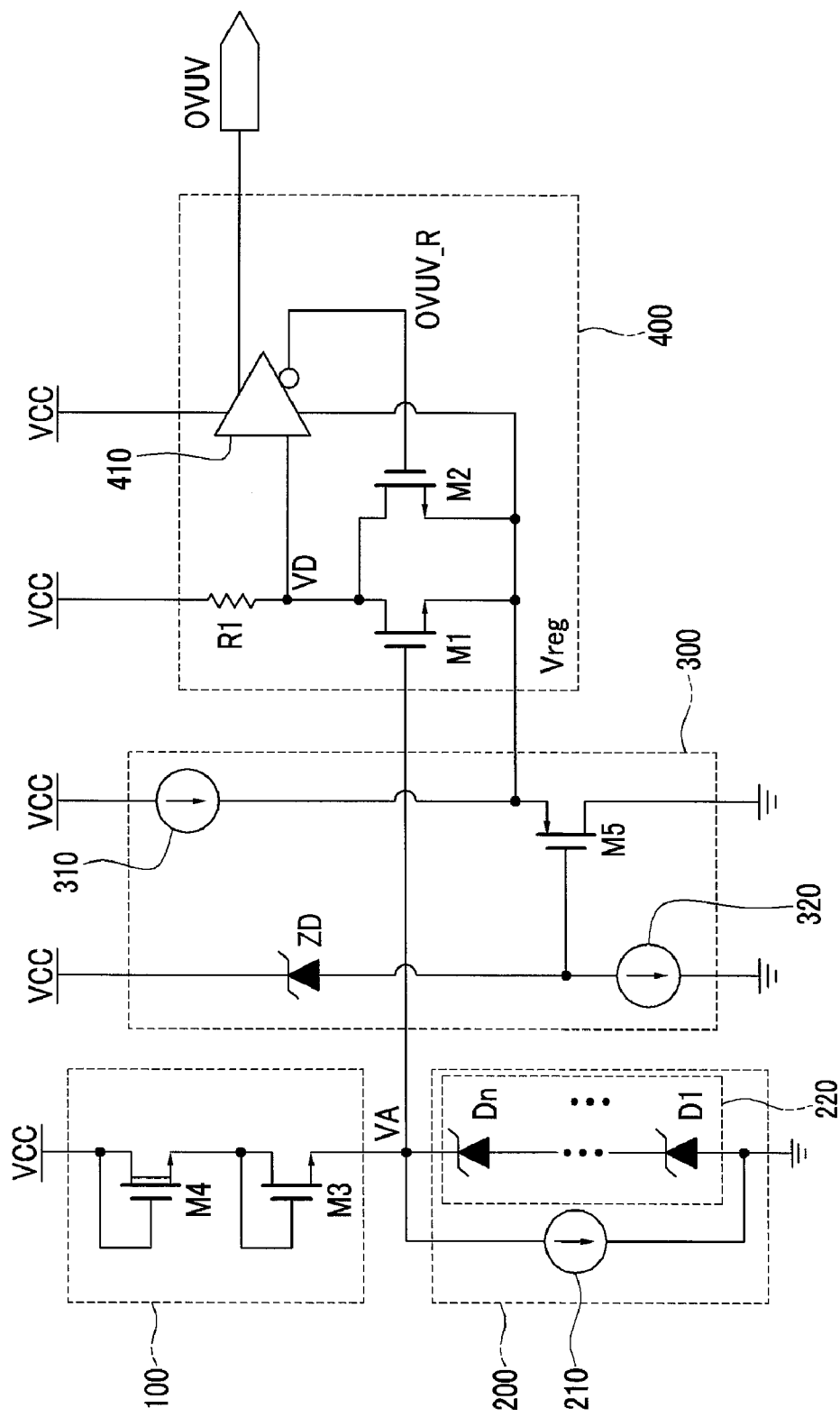
FIG. 4 is a detailed view of a voltage regulator according to the exemplary embodiment of the present invention.

FIG. 4 is a detailed view of the voltage regulator according to the exemplary embodiment of the present invention. FIG. 4 illustrates the current source 110 of the level shifter 100 as a depletion-type transistor M4. The depletion-type transistor M4 has a gate electrode and a drain electrode that are connected to each other so that a constant current can flow without regard to the power source voltage VCC.

The voltage regulator 300 according to the exemplary embodiment of the present invention includes two current sources 310 and 320, a Zener diode ZD, and a transistor M5.

The power source voltage VCC is input to a cathode of the Zener diode ZD, and an anode of the Zener diode ZD is connected with a gate electrode of the transistor M5 and the current source 320. Since the Zener diode ZD is not turned on when the power source voltage VCC is lower than a breakdown voltage, the power source voltage VCC is supplied to the gate electrode of the transistor M5. The Zener diode ZD is turned on when the power source voltage VCC is higher than the breakdown voltage of the Zener diode ZD, and thus a voltage obtained by subtracting the breakdown voltage from the power source voltage VCC is supplied to the gate electrode of the transistor M5. The current source 310 is a constant current source, and supplies a constant current to the transistor M5. The transistor M5 is turned on by a current of the current source 320, and a current of the current source 310 flows to the transistor M5. When a voltage supplied from the Zener diode ZD is increased, a voltage at a source electrode of the transistor M5 is increased. Accordingly, the regulator voltage Vreg of FIG. 3 is generated.

In further detail, when the power source voltage VCC is lower than the third voltage VT3, the transistor M5 operates in a linear region and the gate voltage of the transistor M5 is increased so that the source voltage of the transistor M5 is linearly increased to make the current of the current source 310 flow. While the power source voltage VCC is increased to a fourth voltage VT4 from the third voltage VT3, the transistor M5 operates in a saturation region so that the source voltage of the transistor M5 is maintained at a constant level. When the power source voltage VCC is equivalent to the fourth voltage VT4 and the Zener diode ZD is turned on, the gate electrode of the transistor M5 is applied with a voltage that is obtained by subtracting the breakdown voltage from the power source voltage VCC so that the gate voltage of the transistor M5 is decreased and the transistor M5 operates in the linear region. Thus, the source voltage of the transistor M5 is linearly increased according to the increase of the gate voltage such that the current of the current source 310 flows.

As described, the voltage regulator 300 according to the exemplary embodiment of the present invention generates a regulator voltage Vreg that varies according to a power source voltage VCC.

The transistor M1, transistor M2, and transistor M3 are realized as N-channel type enhanced MOSFETs and the transistor M4 is realized as a p-channel type MOSFET in the exemplary embodiment of the present invention, but the present invention is not limited thereto. That is, they may be respectively realized as an opposite type of MOSFET.

The low-voltage and over-voltage detection circuit according to the exemplary embodiment of the present invention can detect a low-voltage or an over-voltage by using two transistors without using a comparator. In addition, the two transistors have different turn-on states with respect to the same power source voltage according to a case that the power source voltage is increased and a case that the power source voltage is decreased, so that hysteresis occurs.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A low-voltage and over-voltage detection circuit comprising:
   a level shifter receiving a power source voltage and shifting an input voltage to a predetermined level to generate a shift voltage;
   a voltage clamper maintaining the shift voltage at a clamping voltage when the shift voltage is higher than a predetermined clamping voltage;
   a voltage regulator generating a regulator voltage that varies according to the power source voltage; and
   a voltage detector receiving the shift voltage and the regulator voltage, including first and second transistors, and determining whether the power source voltage is a low-voltage or an over-voltage by using a drain voltage generated according to currents flowing to the first and second transistors, the first transistor performing a switching operation according to the shift voltage and the regulator voltage and the second transistor connected to the first transistor in parallel and generating hysteresis.

2. The low-voltage and over-voltage detection circuit of claim 1, wherein the voltage detector comprises a driver receiving the drain voltage, determining the power source voltage to be included in a normal range when the drain voltage is close to the regulator voltage and generating a first-level detection signal, and determining the power source voltage as a low-voltage or an over-voltage when the drain voltage is close to the power source voltage and generating a second-level detection signal.

3. The low-voltage and over-voltage detection circuit of claim 2, wherein the first transistor has a gate electrode to which the shift voltage is input and a source electrode to which the regulator voltage is input, and the second transistor has a source electrode to which the regulator voltage is input and a gate electrode to which a reverse detection signal that is opposite to the detection signal is input.

4. The low-voltage and over-voltage detection circuit of claim 3, wherein the first and second transistors are n-channel type transistors.

5. The low-voltage and over-voltage detection circuit of claim 1, wherein the level shifter comprises:
   a first current source having a first end to which the power source voltage is input, and generating a constant first current; and
   a third transistor being diode-connected and flowing the constant current thereto.

6. The low-voltage and over-voltage detection circuit of claim 5, wherein the voltage clamper comprises:
   a Zener diode row having a first end to which the shift voltage is applied; and
   a second current source connected in parallel with the Zener diode row, and providing a path for the first current before the Zener diode row is turned on.

7. The low-voltage and over-voltage detection circuit of claim 1, wherein the voltage regulator comprises:
   a first current source having a first end to which the power source voltage is applied, and generating a constant current;
   a first Zener diode having a cathode to which the power source voltage is input;
   a second current source connected to an anode of the first Zener diode; and
   a third transistor having a gate electrode connected to the anode of the first Zener diode and a source electrode to which the current of the first current source is supplied, a voltage at the source electrode of the third transistor being equivalent to the regulator voltage.

8. The low-voltage and over-voltage detection circuit of claim 7, wherein the voltage detector comprises a driver supplied with the power source voltage and the regulator voltage, receiving the drain voltage, determining the power source voltage to be included in a normal range when the drain voltage is close to the regulator voltage and generating a first-level detection signal, and determining the power source voltage to be a low-voltage or an over-voltage when the drain voltage is close to the power source voltage and generating a second-level detection signal.

9. The low-voltage and over-voltage detection circuit of claim 8, wherein the first transistor has a gate electrode to which the shift voltage is input and a source electrode connected to a source electrode of the third electrode, and the second transistor has a gate electrode to which a reverse detection signal that is opposite to the detection signal is input and a source electrode connected to the source electrode of the third transistor.

10. The low-voltage and over-voltage detection circuit of claim 1, wherein the regulator voltage sequentially comprises, when the power source voltage is increased:
    a first period during which the regulator voltage is linearly increased or decreased according to the power source voltage;
    a second period during which the regulator voltage is maintained at a constant level; and
    a third period during which the regulator voltage is linearly increased or decreased according to the power source voltage, and
    when the power source voltage is decreased, the regulator voltage sequentially includes the third period, the second period, and the first period.

11. The low-voltage and over-voltage detection circuit of claim 1, wherein the shift voltage sequentially comprises, when the power source voltage is increased:
    a first period during which the shift voltage is maintained at a ground voltage;
    a second period during which the shift voltage is linearly increased or decreased; and
    a third period during which the shift voltage is constantly maintained at the clamping voltage, and
    when the power source voltage is decreased, the shift voltage sequentially includes the third period, the second period, and the first period.

12. A driving method of a low-voltage and over-voltage detection circuit including a first transistor and a second transistor connected in parallel with the first transistor, comprising:
    receiving a power source voltage and generating a shift voltage by shifting the power source voltage to a predetermined level;
    when the shift voltage is higher than a predetermined clamping voltage, fixing the shift voltage as a clamping voltage;

generating a regulator voltage that varies according to the power source voltage;

switching the first transistor according to the shift voltage and the regulator voltage;

determining the power source voltage to be included in a normal range when drain voltages of the first and second transistors are close to the regulator voltage and generating a first-level detection signal, and determining the power source voltage to be a low-voltage or an over-voltage when the drain voltages are close to the power source voltage and generating a second-level detection signal; and switching the second transistor according to a reverse detection signal that is opposite to the detection signal.

13. The driving method of claim 12, wherein the switching the first transistor comprises:

inputting the shift voltage to a gate electrode of the first transistor; and inputting the regulator voltage to a source electrode of the first transistor.

14. The driving method of claim 12, wherein the switching the second transistor comprises:

inputting the reverse detection signal to a gate electrode of the second transistor; and inputting the regulator voltage to a source electrode of the second transistor.

15. The driving method of claim 12, wherein the regulator voltage sequentially comprises, when the power source voltage is increased:

a first period during which the regulator voltage is linearly increased or decreased according to the power source voltage;

a second period during which the regulator voltage is maintained at a constant level; and a third period during which the regulator voltage is linearly increased or decreased according to the power source voltage, and when the power source voltage is decreased, the regulator voltage sequentially comprises the third period, the second period, and the first period.

16. The driving method of claim 12, wherein the shift voltage sequentially comprises, when the power source voltage is increased:

a first period during which the shift voltage is maintained at a ground voltage;

a second period during which the shift voltage is linearly increased or decreased; and a third period during which the shift voltage is constantly maintained at the clamping voltage, and when the power source voltage is decreased, the shift voltage sequentially comprises the third period, the second period, and the first period.

* * * * *